(12) United States Patent
Chung

(10) Patent No.: US 7,060,527 B2
(45) Date of Patent: Jun. 13, 2006

(54) SEMICONDUCTOR PACKAGE HAVING GROOVES FORMED AT SIDE FLASH, GROOVE FORMING METHOD, AND DEFLASHING METHOD USING SEMICONDUCTOR PACKAGE FORMED WITH GROOVES

(75) Inventor: Jae Song Chung, Inchun-Shi (KR)

(73) Assignee: JETTECH, Ltd., Kyunggi-Do (KR)

( * ) Notice: Subject to any disclaimer, the term of this patent is extended or adjusted under 35 U.S.C. 154(b) by 93 days.

(21) Appl. No.: 10/731,943

(22) Filed: Dec. 10, 2003

(65) Prior Publication Data

US 2004/0229397 A1    Nov. 18, 2004

(30) Foreign Application Priority Data

May 12, 2003  (KR)  ...................... 10-2003-0029786

(51) Int. Cl.
    *H01L 21/44*  (2006.01)
(52) U.S. Cl. ...................................... 438/106; 438/127
(58) Field of Classification Search ................ 438/106, 438/127
    See application file for complete search history.

(56) References Cited

U.S. PATENT DOCUMENTS

| 4,627,159 A | 12/1986 | Waldner |
| 5,693,573 A | 12/1997 | Choi |
| 6,417,028 B1 | 7/2002 | Wensel |
| 6,507,095 B1 * | 1/2003 | Hashimoto ................... 257/676 |
| 2002/0127776 A1 * | 9/2002 | Nakajo et al. .............. 438/110 |
| 2005/0214981 A1 * | 9/2005 | Sakano et al. .............. 438/127 |

* cited by examiner

*Primary Examiner*—Thanh Nguyen
(74) *Attorney, Agent, or Firm*—Jordan and Hamburg, LLP

(57) ABSTRACT

Disclosed herein is a deflash technique for removing flash from a portion of a semiconductor package to be plated before a plating process and after a sealing process accompanied by resin molding during the manufacture of semiconductors, and more particularly a semiconductor package having grooves formed at side flash, a groove forming method, and a deflshing method using the semiconductor package, for removing the side flash formed at a side portion of a lead frame where it is difficult to perform a deflashing process. Conventionally, it is impossible to completely remove side flash remaining on the lead frame at a region where it is difficult to perform a deflashing process even by injecting water jet or media at a very high pressure, or by irradiating laser beams thereto while changing irradiation directions. However, according to the present invention, by virtue of the grooves formed at the side flash by laser irradiation, it is possible to easily remove the side flash and to improve deflashing efficiency and quality of products.

4 Claims, 3 Drawing Sheets

SEMICONDUCTOR PACKAGE HAVING GROOVES FORMED AT SIDE FLASH, GROOVE FORMING METHOD, AND DEFLASHING METHOD USING SEMICONDUCTOR PACKAGE FORMED WITH GROOVES

BACKGROUND OF THE INVENTION

1. Field of the Invention

The present invention relates to a deflash technique for removing flash from a portion of a semiconductor package to be plated before a plating process and after a sealing process accompanied by resin molding during the manufacture of semiconductors, and more particularly to a semiconductor package having grooves formed at side flash, a groove forming method, and a deflashing method using the semiconductor package, for removing the side flash formed at a side portion of a lead frame where it is difficult to perform a deflashing process.

2. Description of the Related Art

Generally, existing semiconductor manufacturing processes include a deflashing process in order to remove flash from a semiconductor package. Examples of a well known deflashing process include a deflashing process using high-pressure injection of water jet or other media, and a deflashing process using laser irradiation.

As shown in FIG. 1, on the semiconductor package, designated as reference numeral 1, flash 3 generated during a sealing process accompanied by resin molding is partially attached as impurities at a lead frame 10 near sealing units 12. The flash 3 has to be removed according to the above mentioned deflashing process using the high-pressure injection of water jet or other media, in order to enable a subsequent plating process to be successfully performed. FIGS. 2 and 3 show a state before the deflashing process and a state after the deflashing process, respectively.

Even after the deflashing process using the high-pressure injection of water jet or other media is performed, however, as shown in FIG. 3, side flash 30 is still attached to and remains at corner regions between the sealing units 12 and lead units 14, and cannot be easily removed therefrom. Currently, such side flash is a very difficult problem hard to solve in a deflash technique field.

Although it may seen reasonable to solve the above problem by raising an injection pressure of the water jet or other media so as to improve the removal efficiency of the side flash 30, this solution is undesirable since, when the water jet or other media is injected at a very high pressure over a predetermined appropriate pressure, various negative effects including damage of the sealing units 12 or lead units 14 are caused. Further, in order to inject the water jet or other media at the very high pressure, it is necessary to install supplementary facilities including a pump and the like so as to satisfy requirements of the very high injection pressure, and to overcome various technical difficulties additionally caused by the supplementary facilities. In fact, therefore, it is difficult to apply this solution.

Another deflashing process using laser irradiation is utilized to remove flash, which is attached to the surface of a heat sink usually made of metal during a sealing process in the manufacture of a semiconductor package having the heat sink thereon. The deflashing process using laser irradiation, however, is somewhat troublesome and causes deterioration of deflashing efficiency since the area of the heat sink is relatively large and laser beams must be uniformly irradiated over the whole surface of the heat sink. Further, the laser beams may be accidentally irradiated onto the sealing units in addition to the heat sink, resulting in damage to the sealing units. Therefore, the deflashing process using laser irradiation is unsuitable to be applied so as to directly remove side flash.

Due to the fact that impurities attached on the surface of the heat sink have various shapes and thicknesses, the laser beams must be irradiated at various strengths as occasion demands, but this is not easily accomplished. Therefore, there is a difficulty in practical use of the deflashing process using laser irradiation. For these reasons, currently, the previously mentioned deflashing process using the high-pressure injection of water jet or other media is mainly used.

SUMMARY OF THE INVENTION

The present invention has been made in view of the above problems, and developed on the basis of the fact that, in order to easily and completely remove flash generated during a sealing process, in particular, side flash attached to corner regions between sealing units and lead units of a semiconductor package as regions where it is difficult to perform a deflashing process, it is preferable to form grooves at the corner regions to separate the side flash from the sealing units so that the remaining flash is located only on the lead units, thereby allowing the flash to be maintained in a very easily removable state.

It is an object of the present invention to provide a semiconductor package having grooves, which are formed in side flash attached to corner regions between sealing units and lead units as regions where it is difficult to perform a deflashing process, in particular, a certain part of the side flash located adjacent to the sealing units, and a groove forming method, thereby allowing a subsequent deflashing process to be more effectively performed and improving quality of obtained semiconductor products.

It is another object of the present invention to provide a deflashing method using a semiconductor package formed with grooves at side flash, since the side flash is separated from sealing units of the semiconductor package and attached only to lead units of the semiconductor package due to the grooves, the adherence force of the side flash is weakened, thereby causing the side flash to be easily removed even by an injection pressure lower than the injection pressure of a conventional deflashing process using water jet or other media, resulting in an increase in deflashing efficiency, and by virtue of effective role allotment of a pre-treatment for forming the grooves and an after-treatment for performing a deflashing process, resulting in economical application thereof.

In accordance with one aspect of the present invention, the above and other objects can be accomplished by the provision of a semiconductor package for removing flash from a portion of a semiconductor package to be plated before a plating process and after a sealing process accompanied by resin molding during the manufacture of semiconductors comprising: grooves formed at side flash attached to corner regions between sealing units and lead units as regions where it is difficult to perform a deflashing process after the sealing process, in particular, at a portion of the side flash located at adjacent positions to the sealing units.

In accordance with another aspect of the present invention, the above and other objects can be accomplished by the provision of a method for forming grooves at a semiconductor package in order to remove flash from a portion of the semiconductor package to be plated before a plating process and after a sealing process accompanied by resin molding during the manufacture of semiconductors, comprising the step of: a) forming grooves at side flash attached to corner regions between sealing units and lead units as regions where it is difficult to perform a deflashing process, in particular, at a portion of the side flash located at adjacent positions to the sealing units, by laser irradiation, wherein the grooves are formed by irradiating laser beams at a fixed position while feeding the semiconductor package, or by irradiating the laser beams while changing irradiation directions in a state wherein the semiconductor package is fixed.

Preferably, the grooves may be formed by irradiating the laser beams onto one side of the semiconductor package, or onto both sides of the semiconductor package so that the laser beams irradiated onto both sides of the semiconductor package are alternate to each other, as opposed to than facing each other.

In accordance with yet another aspect of the present invention, the above and other objects can be accomplished by the provision of a deflashing method using a semiconductor package formed with grooves comprising the step of: a) removing side flash, remaining after the grooves are formed at the side flash located at regions where it is difficult to perform a deflashing process, and being maintained in an easily removable state due to the grooves, by injecting water jet or other media.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
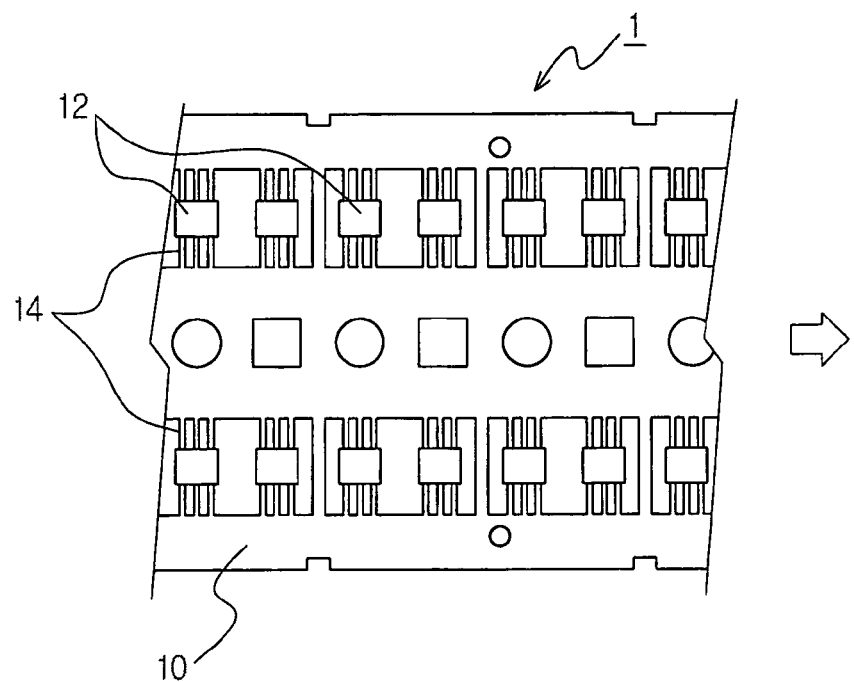
FIG. 1 is a partially cut-away plan view illustrating one example of general semiconductor packages.
Figure 2:
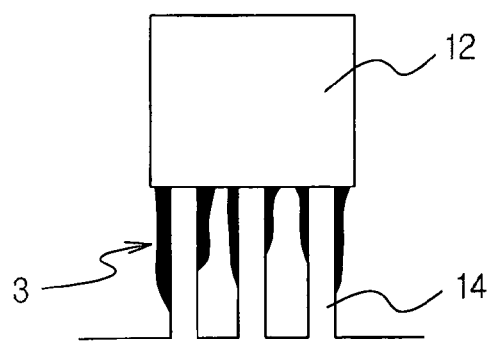
FIGS. 2 and 3 are enlarged plan views, respectively, illustrating a sealing unit and lead units of the semiconductor package shown in FIG. 1, for explaining a conventional deflashing process employing the injection of water jet or other media, FIG. 2 illustrating a flash attached state before a deflashing process, and FIG. 3 illustrating a state after the deflashing process, for explaining a low product quality due to the remaining side flash.
Figure 3:
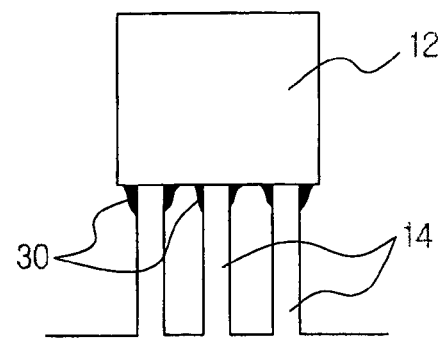
Figure 4:
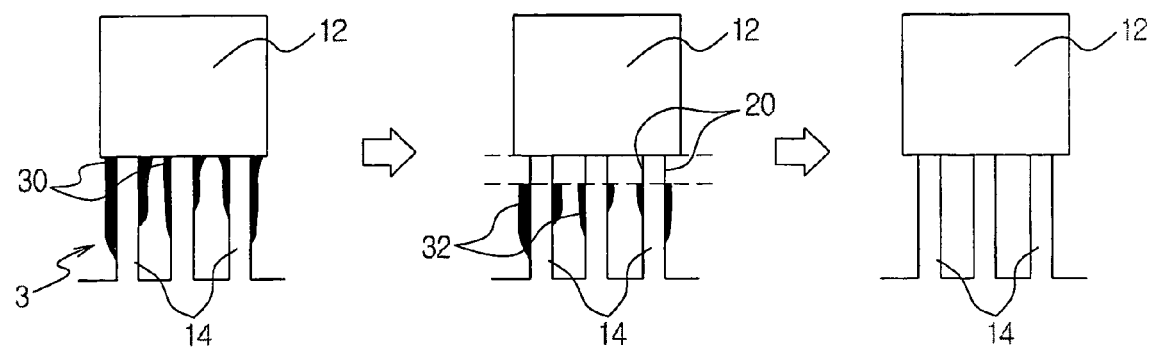
FIG. 4 is an enlarged plan view explaining a sequentially performed deflashing method in accordance with a preferred embodiment the present invention.

Considering a semiconductor package to be applied so as to explain a characteristic technique of a deflashing process for removing flash with reference to FIG. 4, the semiconductor package in accordance with the present invention aims to form grooves 20 at flash 3 as impurities irregularly attached to a lead frame 10 near sealing units 12 as shown in the left side of FIG. 4, in particular, at side flash 30 attached to both the sealing units 12 and lead units 14 as shown in the middle of FIG. 4.

That is, the semiconductor package in accordance with the present invention, for use in the deflashing process for removing flash from a portion of the semiconductor package to be plated before a plating process and after a sealing process accompanied by resin molding during the manufacture of semiconductors, is obtained by forming the grooves 20 at the side flash 30 attached to both the sealing units 12 and the lead units 14 and still remained on regions where it is difficult to perform a deflashing process, in particular, at a portion of the side flash 30 adjacent to the sealing units 12.

The grooves 20 are formed by laser irradiation. That is, the grooves 20 are formed by irradiating laser beams at fixed positions while feeding the semiconductor package 1, or on the contrary, by irradiating the laser beams while changing irradiation directions in a state wherein the semiconductor package 1 is fixed.

Figure 5:
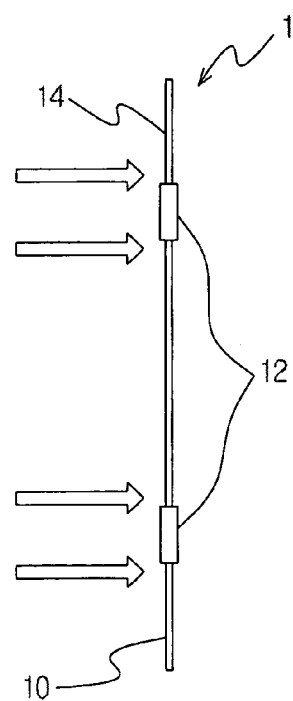
FIG. 5 is a side view illustrating laser irradiation for forming grooves, which is performed onto only one side of the semiconductor package so as to form grooves.
Figure 6:
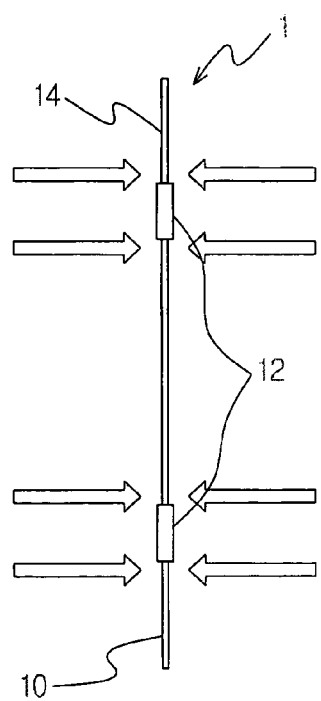
FIGS. 6 and 7 are a partially cut-away side view and a partially cut-away plan view, respectively, illustrating laser irradiation performed onto both sides of the semiconductor package at alternate positions.
Figure 7:
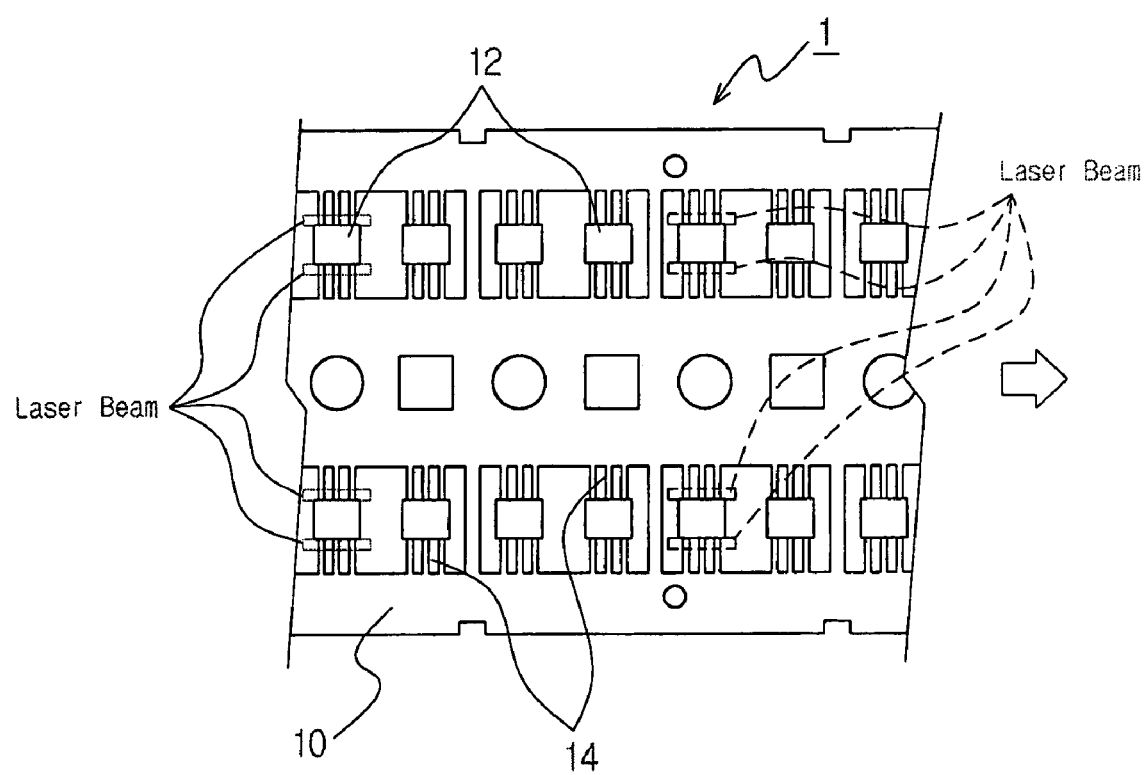

In case that the grooves 20 are formed by irradiating the laser beams at fixed positions while feeding the semiconductor package 1, the laser beams are irradiated onto only one side of the semiconductor package 1 as shown in FIG. 5, or onto both sides of the semiconductor package 1 as shown in FIGS. 6 and 7. In the latter case, the laser beams irradiated at both sides of the semiconductor package 1 are alternate to each other, as opposed to than facing each other.

After the grooves 20 are formed at the side flash 30 located at regions where it is difficult to perform a deflashing process, a deflashing method in accordance with the present invention is performed so as to cause the remaining side flash 30 to be maintained in a more easily removable state by virtue of the grooves 20.

That is, according to the deflashing method of the present invention, the semiconductor package is primarily processed so as to form the grooves 20 at the side flash 30 located at regions where it is difficult to perform a deflashing process by irradiating the laser beams, and then secondarily processed so as to remove the remaining flash 32 located at the remaining region where it is easy to perform a deflashing process. In this case, until all flash 3 is completely removed as shown in the right side of FIG. 4, a deflashing process using the injection of water jet or other media is preferably performed.

Considering the deflashing method in view of the semiconductor package 1, the grooves 20 can be formed as the laser beams are irradiated onto only one side of the semiconductor package 1 as shown in FIG. 5. However, in case that the laser beams are irradiated onto both sides of the semiconductor package 1 at alternate positions as shown in FIGS. 6 and 7, there is a further advantage in that it is possible to completely remove side flash, which may be still remained when the laser beams are irradiated onto one side of the semiconductor package so as to form the grooves 20, as well as flash located at the front or rear surfaces of the lead units 14.

If the laser beams are irradiated onto both sides of the semiconductor package at positions facing each other, instead of the alternate positions as stated above, the laser beams collide with each other, thereby causing damage to the semiconductor package. Therefore, it is important that the laser beams are irradiated at alternate positions when are irradiated at both sides of the semiconductor package.

According to one preferred example of the present invention, in order to remove the side flash 30, attached to both the sealing units 12 and lead units 14 of the semiconductor package 1 and located at regions where it is difficult to perform a deflashing process, by laser irradiation, the laser beams are irradiated onto only one side of the semiconductor package 1 so as to form the grooves 20 under conditions wherein the semiconductor package 1 is supplied at a feeding speed of 5 m/min and a distance between the side flash 30 and the laser beam irradiators is maintained so as not to exceed 20 mm. In this case, it can be confirmed that the grooves 20 can be surely formed.

According to another example of the present invention, where the laser beams are successively irradiated onto both sides of the semiconductor package at alternate positions so as to remove the flash under the same conditions as stated above, it can be confirmed that, in addition to the formation of the grooves 20, the flash located at the front or rear surface of the lead units 14 adjacent to the grooves 20 can be surely removed.

Furthermore, as state above, where the grooves 20 are primarily formed at the semiconductor package 1, and then the deflashing process is secondarily performed as an after-treatment by using the semiconductor package 1 formed with the grooves 20, and particularly, the secondary deflashing process is performed by using water jet injected from four nozzles, which are alternately positioned at both sides of the semiconductor package 1, under a pressure of 300 kg/cm$^2$ in a state wherein the semiconductor package 1 is supplied at a feeding speed of 5 m/min, it can be confirmed that the flash 32 remaining even after the formation of the grooves 20 is completely removed.

As apparent from the above description, the present invention provides a semiconductor package, which is achieved by forming grooves at side flash attached to both sealing units and lead units provided at the semiconductor package and located at corner portions where it is difficult to perform a deflashing process, and a groove forming method, thereby securing an effective deflashing process and improving quality of semiconductor products.

Further, the present invention provides a deflashing method using the semiconductor package formed with the grooves, since the side flash is separated from the sealing units of the semiconductor package and attached only to the lead units of the semiconductor package due to the grooves, the adherence force of the side flash is weakened, thereby causing the side flash to be easily removed even by an injection pressure lower than the injection pressure of a conventional deflashing process using water jet or other media, resulting in an increase in deflashing efficiency, and by virtue of effective role allotment of a pre-treatment for forming the grooves and an after-treatment for performing a deflashing process, resulting in economical application thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming grooves at a semiconductor package in order to remove flash from a portion of the semiconductor package to be plated before a plating process and after a sealing process accompanied by resin molding during the manufacture of semiconductors, comprising the step of:
    a) forming grooves at side flash attached to corner regions between sealing units and lead units as regions where it is difficult to perform a deflashing process, in particular, at a portion of the side flash located at adjacent positions to the sealing units, by laser irradiation,
    wherein the grooves are formed by irradiating laser beams at a fixed position while feeding the semiconductor package.

2. The method as set forth in claim 1, wherein the grooves are formed by irradiating the laser beams while changing irradiation directions in a state wherein the semiconductor package is fixed.

3. The method as set forth in claim 1, wherein the grooves are formed by irradiating the laser beams onto one side of the semiconductor package.

4. The method as set forth in claim 1, wherein the grooves are formed by irradiating the laser beams onto both sides of the semiconductor package so that the laser beams irradiated onto both sides of the semiconductor package are alternate to each other, as opposed to than facing each other.

* * * * *